United States Patent
Kopp et al.

(10) Patent No.: US 10,658,548 B2
(45) Date of Patent: May 19, 2020

(54) METHOD FOR PRODUCING AN OPTOELECTRONIC SEMICONDUCTOR CHIP AND OPTOELECTRONIC SEMICONDUCTOR CHIP

(71) Applicant: OSRAM OLED GMBH, Regensburg (DE)

(72) Inventors: Fabian Kopp, Penang (MY); Attila Molnar, Penang (MY)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/085,934

(22) PCT Filed: Mar. 16, 2017

(86) PCT No.: PCT/EP2017/056281
§ 371 (c)(1),
(2) Date: Sep. 17, 2018

(87) PCT Pub. No.: WO2017/158113
PCT Pub. Date: Sep. 21, 2017

(65) Prior Publication Data
US 2019/0103520 A1    Apr. 4, 2019

(30) Foreign Application Priority Data
Mar. 18, 2016   (DE) .................. 10 2016 105 056

(51) Int. Cl.
*H01L 33/46*   (2010.01)
*H01L 33/38*   (2010.01)
*H01L 33/42*   (2010.01)

(52) U.S. Cl.
CPC .............. *H01L 33/46* (2013.01); *H01L 33/38* (2013.01); *H01L 33/42* (2013.01)

(58) Field of Classification Search
CPC ......... H01L 33/44; H01L 33/38; H01L 33/46; H01L 33/42; H01L 33/54; H01L 21/266;
(Continued)

(56) References Cited

U.S. PATENT DOCUMENTS

| 2002/0102760 | A1* | 8/2002 | Gottfried | .......... H01L 21/28575 |
| | | | | 438/39 |
| 2010/0218819 | A1* | 9/2010 | Farmer | ............. H01L 31/02167 |
| | | | | 136/256 |

(Continued)

FOREIGN PATENT DOCUMENTS

| DE | 102008038725 A1 | 2/2010 |
| DE | 102008038750 A1 | 2/2010 |

(Continued)

OTHER PUBLICATIONS

International Search Report and Written Opinion dated May 4, 2017 in PCT Application No. PCT/EP2017/05681, English translation of International Search Report included.

*Primary Examiner* — Caridad Everhart
(74) *Attorney, Agent, or Firm* — MH2 Technology Law Group, LLP

(57) ABSTRACT

A method for producing an optoelectronic semiconductor chip is specified, wherein a method step A) involves providing a semiconductor layer stack comprising a semiconductor layer of a first type, a semiconductor layer of a second type and an active layer arranged between the semiconductor layer of the first type and the semiconductor layer of the second type. Furthermore, the method comprises in a method step B) forming a mesa structure in the semiconductor layer of the first type, the semiconductor layer of the second type and the active layer. The method furthermore comprises in a method step C) applying a passivation layer to the mesa structure by means of vapour deposition or sputtering.

16 Claims, 6 Drawing Sheets

Figure 1A:
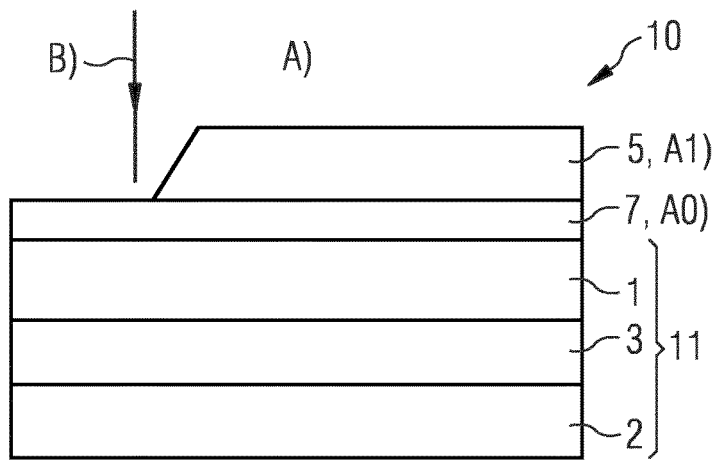

(58) Field of Classification Search
CPC ........... H01L 21/30612; H01L 33/2003; H01L 33/20; H01L 33/005; H01L 33/385; H01L 33/387; H01L 21/00; H01L 21/0237; H01L 21/02458; H01L 21/0254; H01L 31/1868

See application file for complete search history.

(56) References Cited

U.S. PATENT DOCUMENTS

| | | | |
|---|---|---|---|
| 2011/0024781 A1 | 2/2011 | Fujimoto et al. | |
| 2011/0193123 A1 | 8/2011 | Moon et al. | |
| 2011/0220942 A1 | 9/2011 | Choi et al. | |
| 2011/0297914 A1 | 12/2011 | Zheng et al. | |
| 2012/0164773 A1* | 6/2012 | Tu | H01L 33/20 438/47 |
| 2012/0298954 A1* | 11/2012 | Kim | H01L 33/42 257/13 |
| 2013/0017638 A1* | 1/2013 | Tsuji | H01S 5/2275 438/40 |
| 2013/0049063 A1 | 2/2013 | Kafuku et al. | |
| 2013/0260490 A1* | 10/2013 | Shatalov | H01L 33/20 438/27 |
| 2015/0255494 A1* | 9/2015 | Hogan | H01L 27/1288 438/585 |
| 2015/0255692 A1 | 9/2015 | Pfeuffer | |
| 2015/0349196 A1* | 12/2015 | Kim | H01L 33/38 257/99 |

FOREIGN PATENT DOCUMENTS

| | | |
|---|---|---|
| DE | 102009033686 A1 | 1/2011 |
| DE | 102011010503 A1 | 8/2012 |
| DE | 102011010504 A1 | 8/2012 |
| DE | 102012112530 A1 | 6/2014 |
| DE | 102014111482 A1 | 2/2016 |
| DE | 102014115740 A1 | 5/2016 |
| DE | 102015117662 A1 | 4/2017 |
| WO | 2012107290 A1 | 8/2012 |

* cited by examiner

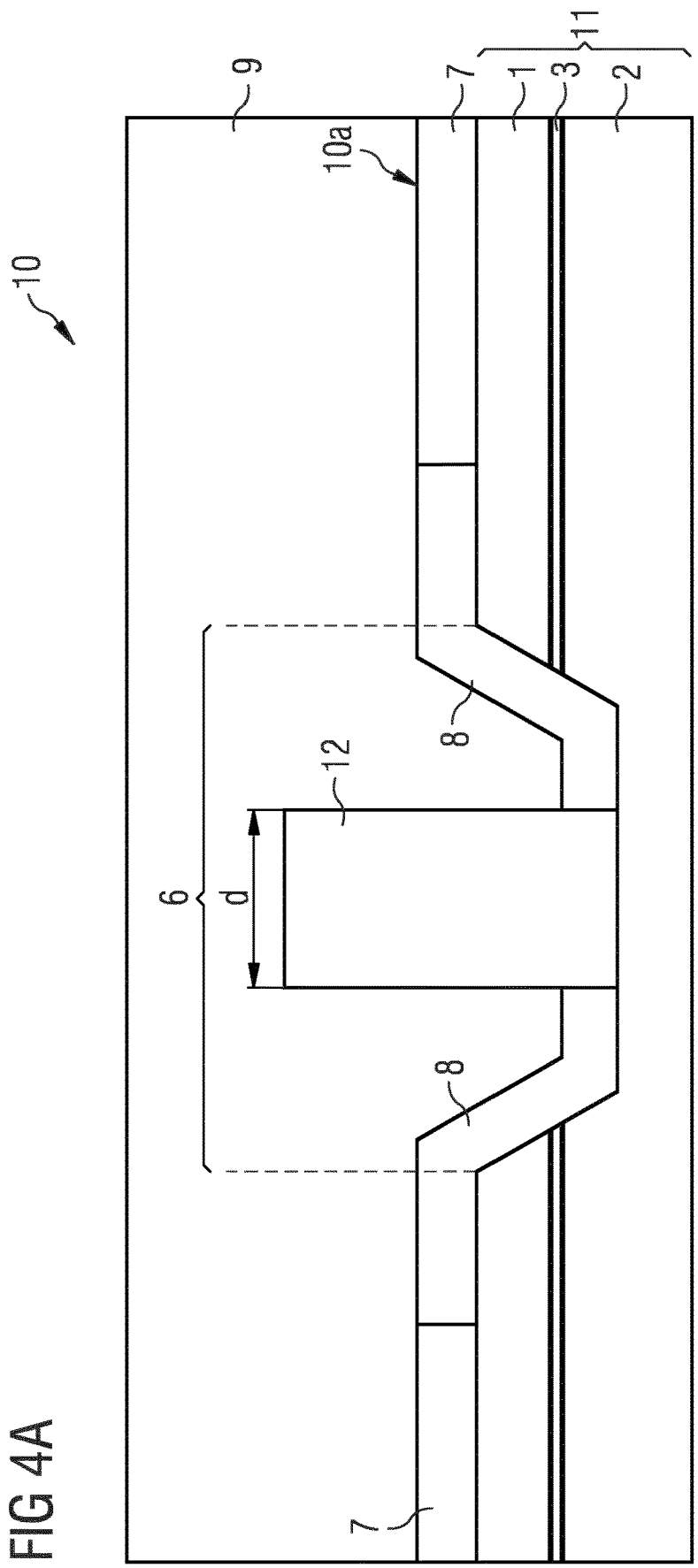

METHOD FOR PRODUCING AN OPTOELECTRONIC SEMICONDUCTOR CHIP AND OPTOELECTRONIC SEMICONDUCTOR CHIP

This application is a United States National Phase under 35 U.S.C. § 371 of International Application No. PCT/EP2017/056281, filed on Mar. 16, 2017, which claims priority to German Patent Application No. 10 2016 105 056.3, filed Mar. 18, 2016, both of which are hereby incorporated by reference in their entirety for all purposes.

The invention relates to a method for producing an optoelectronic semiconductor chip and an optoelectronic semiconductor chip.

The invention has for its object to provide a method for producing an optoelectronic semiconductor chip and an optoelectronic semiconductor chip, which is characterized by an improved passivation of a mesa structure and improved emission efficiency.

These objects are achieved by a product and a method according to the independent claims. Advantageous embodiments and further developments of the invention are subject of the dependent claims.

According to at least one embodiment, the method for producing an optoelectronic semiconductor chip in a method step A) comprises providing a semiconductor layer stack comprising at least one semiconductor layer of a first type, at least one semiconductor layer of a second type and an active layer disposed between the semiconductor layer of the first type and the semiconductor layer of the second type. Furthermore, in a method step B), the method comprises forming a mesa structure in the semiconductor layer of the first type, the semiconductor layer of the second type and the active layer. The method further comprises, in a method step C), applying a passivation layer to the mesa structure, preferably by means of vapor deposition or sputtering.

The semiconductor layer of a first type and the semiconductor layer of a second type may each comprise one or more n-doped or p-doped semiconductor layers. In this case, advantageously either the n-doped or the p-doped semiconductor layer of the semiconductor layer stack is a radiation side of the semiconductor layer stack or the semiconductor chip.

The semiconductor layers of the semiconductor chip are based preferably on an III-V compound semiconductor material. The semiconductor material is preferably a nitride compound semiconductor material such as $Al_nIn_{1-n-m}Ga_mN$ or a phosphide compound semiconductor material such as $Al_nIn_{1-n-m}Ga_mP$, wherein each $0 \leq n \leq 1$, $0 \leq m \leq 1$ and $n+m \leq 1$. Likewise, the semiconductor material may be $Al_xGa_{1-x}As$ with $0 \leq x \leq 1$. In this case, the semiconductor layer sequence can have dopants and additional constituents. For the sake of simplicity, however, only the essential constituents of the crystal lattice of the semiconductor layer sequence, i.e. Al, As, Ga, In, N or P, are indicated, even if these can be partially replaced and/or supplemented by small amounts of further substances.

The active layer is advantageously designed as an active zone suitable for the emission of radiation. The active layer can be formed, for example, as a double heterostructure, as single quantum well structure or multiple quantum well structure.

The mesa structure is advantageously formed laterally to the semiconductor layer of the first and second type and the active layer, for example, as a side flank. Advantageously, the mesa structure extends as an oblique side edge completely through at least the semiconductor layer of the first type and through the active layer or completely through the semiconductor layer of the second type and through the active layer. The formation of the mesa structure is advantageously carried out by means of a dry or wet chemical etching process. The mesa structure can advantageously be formed as a mesa trench or mesa edge.

The passivation layer advantageously completely reshapes the mesa structure and provides mechanical protection as well as moisture protection for the mesa structure. Furthermore, it is advantageous to reduce the risk of leakage currents at the junctions of the semiconductor layer of the first type, of the second type and of the active layer, which can be produced for example by electrically conductive particles on the side surface of the mesa structure. The application of the passivation layer to the mesa structure advantageously takes place immediately after the formation of the mesa structure, as a result of which impurities resulting from the production process on the mesa structure and resulting leakage currents can advantageously be reduced or avoided. The passivation layer advantageously comprises an electrically insulating material. To reduce the out coupling of radiation via the mesa structure, the passivation layer may advantageously comprise a reflective material. As a result, an intensity of the radiated radiation can advantageously be increased at a radiating surface of the semiconductor chip provided for this purpose.

The passivation layer comprises, for example, at least one of the materials $Al_2O_3$, $TaO_5$, $ZrO_2$, $ZnO$, $SiN_x$, $SiO_xN_y$, $SiO_2$, $TiO_2$, $ZrO_2$, $HfO_2$, $Nb_2O_5$ or $MgF_2$, or consists thereof.

The passivation layer can be a reflection-enhancing layer and advantageously has a plurality of dielectric layers, the at least one first dielectric layer of a first dielectric material having a refractive index n1 and at least one second dielectric layer of a second dielectric material having a refractive index n2>n1. The first dielectric material advantageously has a low refractive index, preferably n1<1.7, and the second dielectric material has a high refractive index n2>1.7, preferably n2>2. The dielectric layer sequence functions as an interference layer system whose reflection-enhancing effect is based on multiple reflections at the interfaces between the dielectric layers having the different refractive indices n1, n2. The layer thicknesses of the dielectric layers in the dielectric layer sequence are advantageously optimized such that the dielectric layer sequence has the highest possible reflection in the region of the emission spectrum of the active layer, in particular at the dominant wavelength and the dominant angle of the emitted radiation. According to at least one advantageous embodiment, the active layer is suitable for emitting radiation having a dominant wavelength $\lambda$, wherein for the thickness d1 of the at least one first dielectric layer $0.01\lambda/4 \leq n1*d1 \leq 10\lambda/4$ and for the thickness d2 of the at least one second dielectric layer is $0.01\lambda/4 \leq n2*d2 \leq 10\lambda/4$. Preferably, $0.5\lambda/4 \leq n1*d1 \leq 5\lambda/4$ and $0.5\lambda/4 \leq n2*d2\ 5\lambda/4$.

The application of the passivation layer by vapor deposition or sputtering is advantageously characterized in that it can be applied structured with a high degree of accuracy, for example by means of a lithography method.

According to at least one embodiment of the method, an electrically conductive layer is applied over the semiconductor layer of the first type or the semiconductor layer of the second type after the method step A) and before the method step B) in a method step A0).

The electrically conductive layer is advantageously designed for making electrical contact with a p-doped or n-doped semiconductor layer. The electrically conductive layer is for example formed for p-contacting the optoelectronic semiconductor chip, wherein advantageously the electrically conductive layer directly contacts the p-doped Semiconductor layer. The semiconductor chip, for example, may comprise additionally a bond pad or an external contact point and/or one or more contact lands. "Applied over the p-doped semiconductor layer" is understood here and below that the electrically conductive layer is arranged directly or indirectly in electrical and/or mechanical contact with the p-doped semiconductor layer. In the case of indirect contact, further layers or further elements may be arranged at least in regions between the p-doped semiconductor layer and the electrically conductive layer.

The electrically conductive layer may be transparent. In particular, the electrically conductive layer is permeable to the emitted radiation. The electrically conductive layer may cover a comparatively large proportion of the p-doped semiconductor layer. Preferably, the electrically conductive layer covers the majority of the p-doped semiconductor layer or, apart from an optional range for a further element or due to the lateral distance of the electrically conductive layer to an edge of the mesa structure even applied over the entire surface of the p-doped semiconductor layer. In this way, a good current expansion in the semiconductor layer sequence is achieved. The electrically conductive layer preferably contains a transparent, conductive oxide (TCO transparent conductive oxide), such as ITO.

Transparent, electrically conductive oxides (TCO) are transparent, electrically conductive materials, usually metal oxides, such as zinc oxide, tin oxide, cadmium oxide, titanium oxide, indium oxide, indium tin oxide (ITO) or aluminum zinc oxide (AZO) or copper oxide. In addition to binary metal oxygen compounds such as $ZnO$, $SnO_2$ or $In_2O_3$ also ternary metal oxygen compounds such as $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent, conductive oxides belong to the group of TCOs. Furthermore, the TCOs do not necessarily correspond to one stoichiometric composition and may also be p- or n-doped.

According to at least one embodiment of the method, a structured mask is applied to the semiconductor layer of the first type or to the semiconductor layer of the second type prior to method step B) in a method step A1). In particular, the mask may be directly or indirectly arranged on the semiconductor layer of the first type or semiconductor layer of the second type. For example, a mask comprising photoresist, silicon dioxide ($SiO_2$) or silicon nitride ($SiN_x$) is applied on the semiconductor layer of the first type or on the semiconductor layer of the second type. The mask comprises, for example, a positive resist and comprises furthermore, an oblique side flank, which faces the mesa structure, wherein after forming the mesa structure, the oblique side of the mask continues in the semiconductor layer stack. A mask of silicon dioxide or silicon nitride is also referred to as a hard mask. The patterning of the mask is advantageously chosen for the formation of a mesa structure in the semiconductor layers in a corresponding structure for the mesa. In forming the mesa structure, an electrically conductive layer on the semiconductor layer stack may be at least partially removed, so that, for example, a gap between the mask and the semiconductor layer stack is generated. The electrically conductive layer can in this case be partially thinned.

In accordance with at least one embodiment of the method, after method step B) and before method step C) in a method step B1), the mask is partially removed from the electrically conductive layer by means of a plasma.

For example by means of an oxygen containing plasma, the mask, which is for example made from photoresist, advantageously is partially removed. The length of a resist withdrawal from the mesa structure is adjustable by the duration of the oxygen process. As a result, the surface of the electrically conductive layer is free of the resist or the mask, for example in the edge region of the mesa structure.

According to at least one embodiment of the method, prior to method step C) in a method step B2), the electrically conductive layer is partially removed from the semiconductor layer of the first type or from the semiconductor layer of the second type by means of a plasma.

Dry chemical etching of the semiconductor layer of the first type or of the second type and of the electrically conductive layer can be carried out, for example, in an ICP plant (ICP, inductively coupled plasma).

Advantageously, the steps B1) and B2) take place in the same plant, however the process steps can also be carried out successively in different process chambers. Depending on the material of the electrically conductive layer, a plasma suitable for ablation in step B2) is applied. If the electrically conductive layer includes, for example transparent conductive oxide, in particular ITO, a chlorine-containing plasma is advantageously used. If the electrically conductive layer comprises, for example, a noble metal or a thin transparent conductive oxide layer, an argon-containing plasma is advantageously used. Advantageously, the semiconductor layer, which before process step B2) is located immediately below the electrically conductive layer, is after process step B2) partially exposed.

Alternatively, steps B1) and B2) may also be performed in different plants. For example, step B1), i.e. the treatment by means of oxygen-containing plasma, can take place in an asking plant.

According to at least one embodiment of the method, after the method step B1) and before the method step C), a wet-chemical etching process is carried out in a method step B3), wherein the electrically conductive layer is at least partially removed in a region L, which directly adjoins the mesa structure and extends partially below the mask.

The application of a wet chemical etching process in Process step B3) makes it possible to etch the electrically conductive layer advantageously so that at least one partial removal of the electrically conductive layer is not bound to the predetermined structure by the mask. Depending on the duration of the etching process, it is possible to control how much material of the electrically conductive layer is removed and how far a gap resulting from the etching extends underneath the mask between the mask and the electrically conductive layer. The dimension of the gap is further dependent on the thickness of the electrically conductive layer.

After the wet-chemical etching process advantageously the passivation layer can be applied to the mesa structure, so that the passivation layer extends at least partially into the gap between the mask and the electrically conductive layer. The passivation layer advantageously prevents or reduces leakage currents between the mesa structure and the electrically conductive layer. However, if the gap is formed very narrowly, for example, with a thickness of the electrically conductive layer of less than or equal to 150 nm, the passivation layer extends only slightly or not into the gap. The passivation layer is advantageously also applied on the mask. The passivation layers on the semiconductor layer stack and on the mask are advantageously not connected with each other and are interrupted by the gap. If the passivation layer extends into the gap, it may at least partially cover the electrically conductive layer in the gap or not be in direct contact therewith. For example, in the gap an overlap of passivation layer and electrically conductive layer is present. Because the passivation layer on the mask and on the semiconductor layer stack are not in direct connection, advantageously the mask can be easily separated from the electrically conductive layer without having to deduct or demolish the passivation layer.

Advantageously, it is possible to control by a further method step to which regions of the semiconductor layer stack the passivation layer is applied, wherein by means of an oxygen-containing plasma the mask is removed again in a direction away from the mesa structure before the application of the passivation layer.

According to at least one embodiment of the method, the semiconductor chip comprises a sapphire substrate, a SiC substrate or a GaN substrate. The semiconductor chip is advantageously a volume emitter. In other words, such a semiconductor chip not only emits light exclusively through a radiation side, but emits light in several directions in its surrounding volume. In particular, the substrate may be transparent, so that light can be emitted at least partially through the transparent substrate. Transparent substrates are, for example, SiC or sapphire or GaN.

In accordance with at least one embodiment of the method, the mask is completely removed after method step C). After the complete removal, a correspondingly structured passivation layer advantageously remains, depending on the structuring of the mask.

According to at least one embodiment of the method, the passivation layer comprises a dielectric layer stack.

In accordance with at least one embodiment of the method, the dielectric layer stack comprises an adhesion layer, wherein after the application of the passivation layer, the adhesion layer faces the semiconductor layer stack.

By means of an adhesion layer, the adhesion of the dielectric layer stack to the semiconductor layer stack and for example, on the electrically conductive layer may be improved advantageously. The adhesive layer has for example, a thickness of less than 20 nm, preferably less than 10 nm.

According to at least one embodiment of the method, the removal of the mask in method step B1) or the removal the electrically conductive layer in the process step B2) is controlled by the duration of the process step B1) or the process step B2).

Advantageously, by the duration of the application of the plasma to the mask or the electrically conductive layer, the degree of removal of the mask or the electrically conductive layer can be handled, because the amount of material removal depends on the time of the plasma application.

According to at least one embodiment of the method, the semiconductor layer of the first type or the semiconductor layer of the second type is provided with a roughened surface. The roughening of the surface advantageously improves the decoupling of light from the respective semiconductor layer. In this case, it is advantageous to roughen that semiconductor layer which terminates the semiconductor layer stack in a radiation direction.

In accordance with at least one embodiment of the method, the passivation layer is applied at least partially on the roughened surface. The application of a passivation layer at least partially on the roughened surface of a semiconductor layer, which terminates the semiconductor layer stack in a radiation direction, proves to be particularly advantageous in the case of exclusively surface emitting semiconductor chips.

According to at least one embodiment of the method, an encapsulation is applied to a radiation side of the semiconductor chip after method step C). The encapsulation includes, for example, silicone or epoxy resin, and may include a converter material.

The encapsulation advantageously covers the passivation layer as well as the electrically conductive layer, in case the electrically conductive layer itself is arranged on a radiation side of the semiconductor chip. In case areas of the semiconductor layers of the first or second type are not covered by the electrically conductive layer or the passivation layer, these regions can advantageously also be covered only by the encapsulation. The encapsulation can advantageously also cover the passivation layer within the mesa structure.

Advantageously, in addition to the passivation layer, a further passivation can be applied to the semiconductor layer stack so that the further passivation completely covers the semiconductor layer stack and the passivation layer.

The selection of a high-index material on one radiation side of the semiconductor chip is oriented advantageously on the refractive index of the high refractive index material. For example, a transition from the refractive index of semiconductor layer via the electrically conductive layer and the passivation layer, if they overlap, is chosen so that a total reflection at the interfaces of said layers is advantageously reduced or avoided.

The encapsulation may advantageously comprise a converter material. For example, the active layer produces blue light which is transmitted through the electrically conductive layer and at least partially converted in the encapsulation by a converter material.

It is also an optoelectronic semiconductor chip specified. Preferably, the optoelectronic semiconductor chip is manufactured by the method described above. Thus, all features disclosed for the process are also disclosed for the optoelectronic semiconductor chip and vice versa.

The optoelectronic semiconductor chip according to at least one embodiment comprises a semiconductor layer stack having at least one semiconductor layer of a first type, at least one semiconductor layer of a second type and an active layer disposed between the semiconductor layer of the first type and the semiconductor layer of the second type, wherein a mesa structure in the semiconductor layer of the first type, the semiconductor layer of the second type and the active layer is formed. Furthermore, the semiconductor chip comprises a passivation layer on the mesa structure, wherein the semiconductor chip comprises a sapphire substrate, a SiC substrate or a GaN substrate and an electrically conductive layer over the semiconductor layer of the first type or over the semiconductor layer of the second type.

The semiconductor chip is advantageously designed as a volume emitter. In particular, at least part of the emitted radiation is coupled out through the substrate. By the passivation of the mesa structure, it is advantageously protected against mechanical damage and electrical short circuits or leakage currents.

The passivation layer extends partially onto the electrically conductive layer, wherein the passivation layer extends onto the electrically conductive layer at most 10 μm, in particular at most 5 μm, in a direction away from the mesa structure. Advantageously, a reflection of light at the interface between the passivation layer and the electrically conductive layer can be achieved. In regions in which the electrically conductive layer is at least partially not covered by the passivation layer, the light can be coupled out through the electrically conductive layer, wherein by an appropriate choice of refractive indices the total reflection at the interface between the electrically conductive layer and the environment can be reduced.

In accordance with at least one embodiment of the optoelectronic semiconductor chip, the semiconductor chip comprises a further passivation layer, which is arranged on the electrically conductive layer and on the passivation layer.

The further passivation layer advantageously extends over the entire semiconductor chip and covers the passivation layer and the electrically conductive layer advantageously completely. Also further components of the semiconductor chips, such as the contact land, may be at least partially covered by the further passivation layer. The further passivation layer comprises, for example, a dielectric layer or a dielectric layer stack. It is also possible that the further passivation layer comprises a dielectric layer or a dielectric layer stack together with a Bragg mirror.

According to at least one embodiment of the optoelectronic semiconductor chip, the semiconductor chip comprises a contact land, which is arranged in the mesa structure and which contacts the semiconductor layer stack electrically, wherein the passivation layer is located partially between the semiconductor layer stack and the contact land.

According to at least one embodiment of the optoelectronic semiconductor chip, the semiconductor layer stack comprises on one outer side a side surface with a structured surface and a recess, wherein a side surface of the semiconductor layer stack faces the recess and has a smooth surface.

The structured surface advantageously has a plurality of recesses and depressions, for example a waveform.

In a plan view of the semiconductor layer stack the waveform can advantageously have a circumferential structure at its edges, for example a perforation, similar to the edge of a stamp.

Further advantages, advantageous embodiments and further developments emerge from the following in connection with the figures described embodiment.

FIGS. 1a, 1b, 2a and 2b each show a schematic side view of the optoelectronic semiconductor chips during the process for producing the optoelectronic semiconductor chip.

Figure 1B:
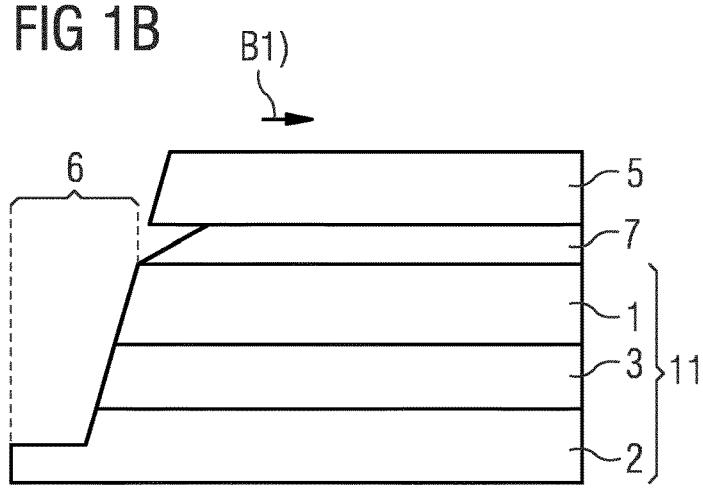
Figure 1C:
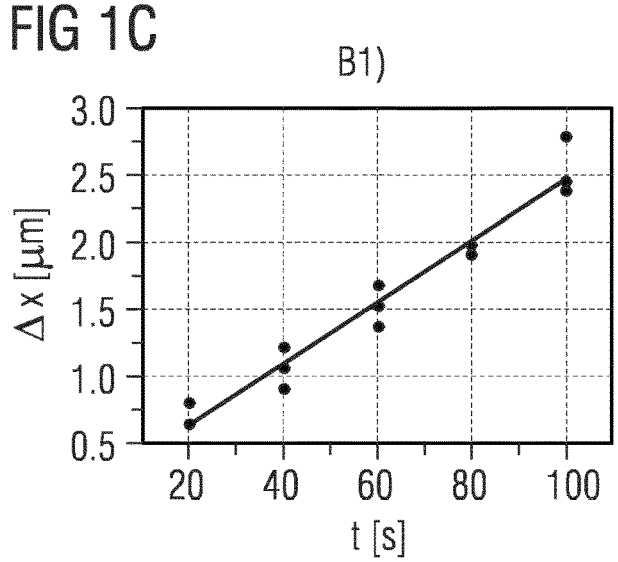

FIG. 1c shows a process diagram for the application of a plasma.

Figure 3A:
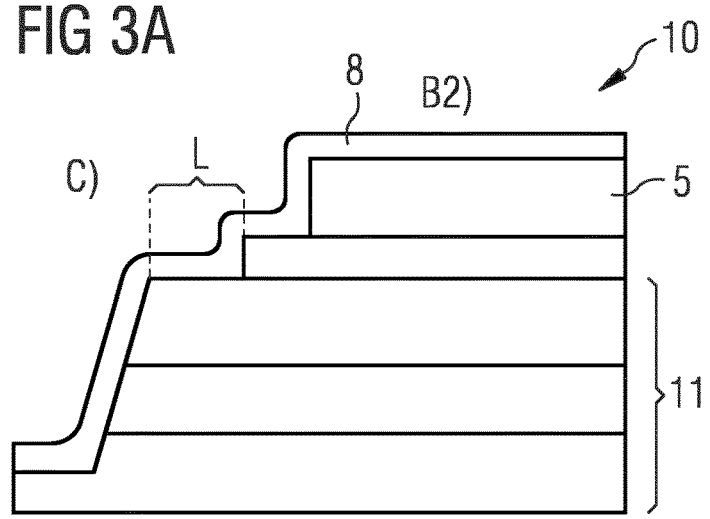
Figure 3B:
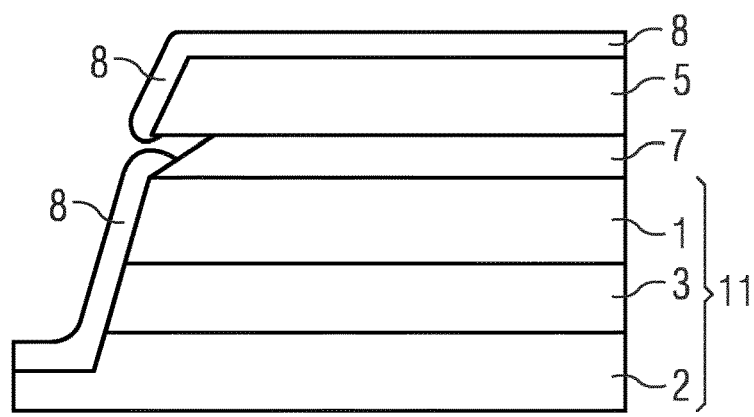
Figure 3C:
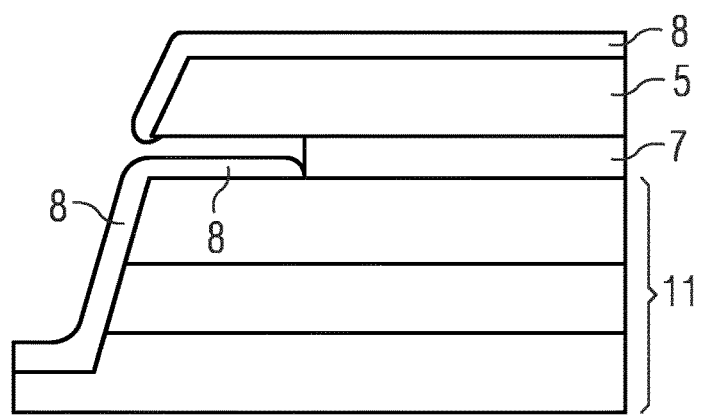

FIGS. 3a, 3b and 3c each show a schematic side view of the optoelectronic semiconductor chip during the method for producing the optoelectronic semiconductor chip.

Figure 4B:
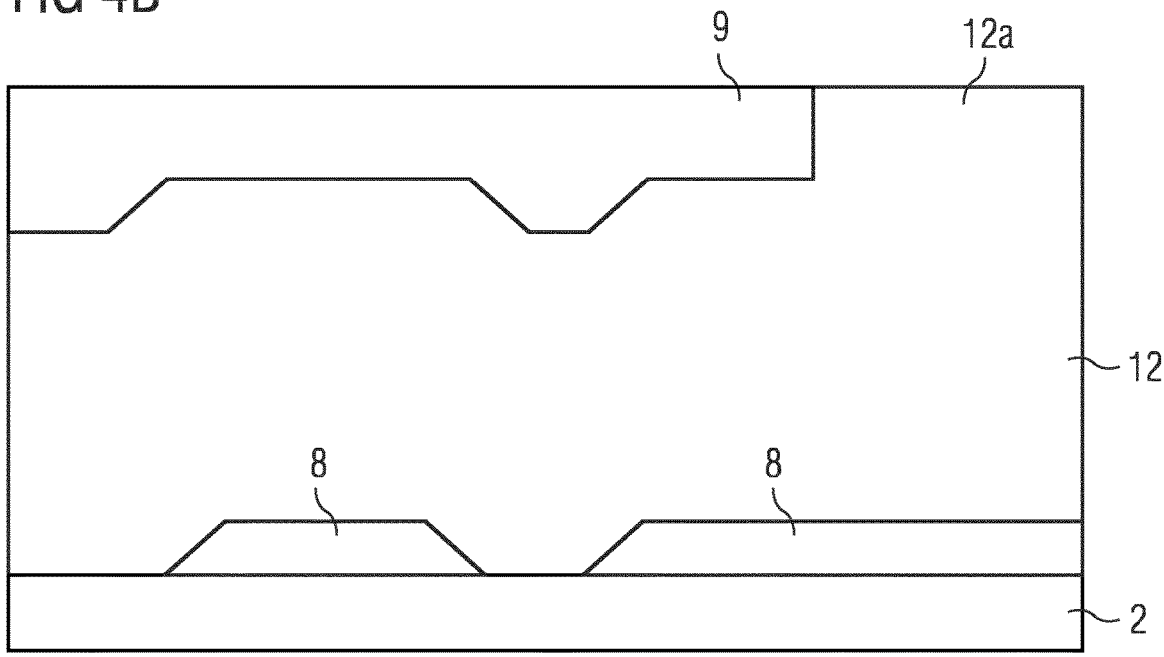

FIGS. 4a and 4b each show a schematic cross section through the optoelectronic semiconductor chip.

Figure 4C:
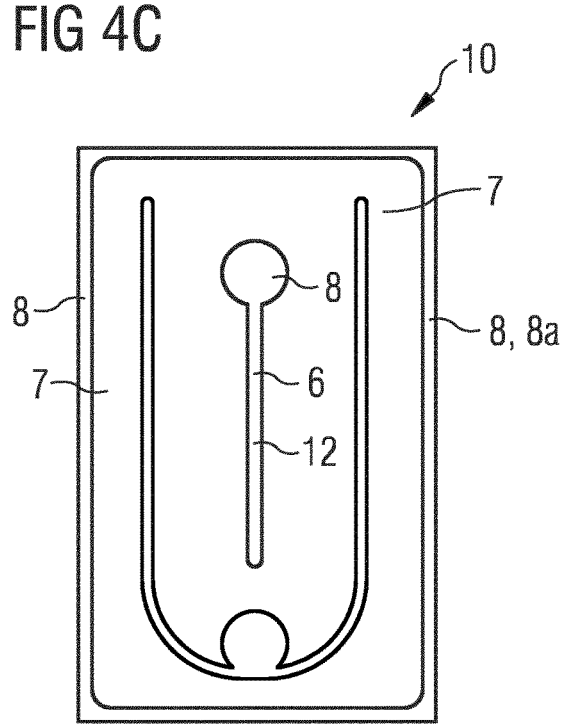
Figure 4D:
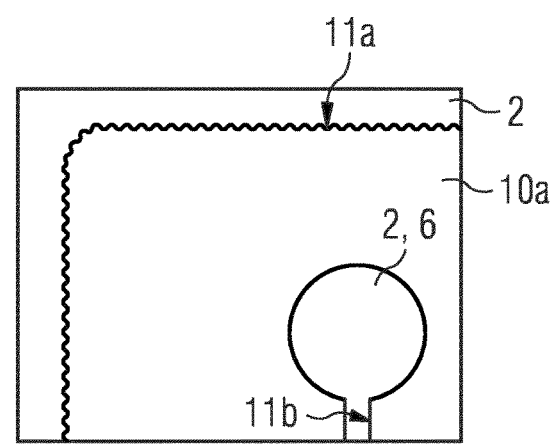

FIGS. 4c and 4d show a plan view of the optoelectronic semiconductor chip.

Figure 5A:
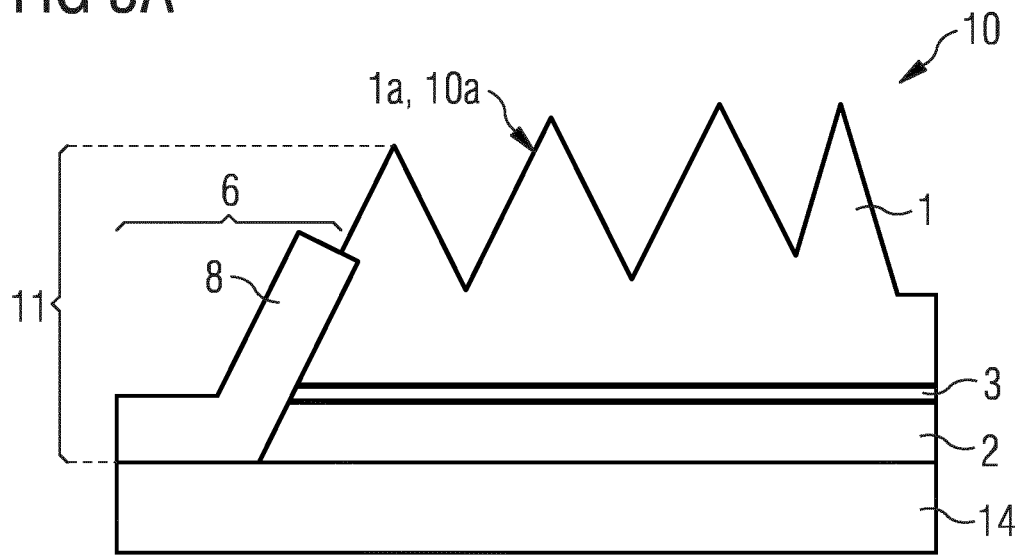
Figure 5B:
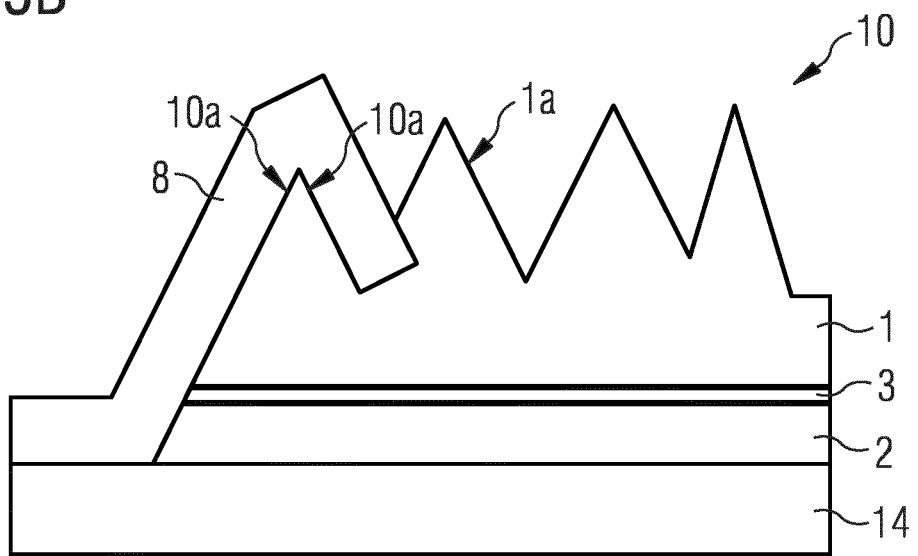

FIGS. 5a and 5b each show a schematic side view of the optoelectronic semiconductor chip.

Identical or equivalent elements are each provided with the same reference numerals in the figures. The components shown in the figures and the proportions of the components with respect to each other are not to be considered as true to scale.

FIG. 1a shows the optoelectronic semiconductor chip 10 with a semiconductor layer stack 11 comprising a Semiconductor layer of a first type 1, a semiconductor layer of a second type 2, and an active layer 3 arranged between the semiconductor layer of the first type 1 and the semiconductor layer of the second type 2, which are provided in one process step A). The semiconductor layer of the first type 1 is p-doped, for example, and the semiconductor layer of the second type 2 is, for example, n-doped. The semiconductor layer stack 11 is advantageously arranged on a substrate (not shown), wherein, for example, the p-doped semiconductor layer of the first type 1 faces away from the substrate. The substrate may advantageously be a sapphire substrate, wherein the semiconductor chip 10 may be formed as a volume emitter. In a process step A0) an electrically conductive layer 7 is subsequently applied at least partially to the p-doped semiconductor layer 1. In this way, a good current expansion in the p-doped semiconductor layer 1 is achieved. The electrically conductive layer 7 contains preferably a transparent, conductive oxide (TCO Transparent Conductive Oxide), such as ITO.

In a subsequent method step A1), a structured mask 5 is applied to the p-doped semiconductor layer 1 and to the electrically conductive layer 7. The structured mask 5 advantageously comprises photoresist, for example, a positive resist. The structuring of the mask is advantageously chosen for a subsequent formation of a mesa structure in the semiconductor layers in a corresponding structure for the mesa. The mask 5 comprises an oblique side edge, which faces the mesa structure to be formed. In a subsequent process step B) an etching process take place, so that a mesa structure in the semiconductor layer stack 11 is introduced. FIG. 1a shows the semiconductor layer stack 11 before the etching.

FIG. 1b shows the semiconductor layer stack 11 from FIG. 1a after a method step B) and after a further method step B1), after which the mask 5 is partially removed from the electrically conductive layer 7 and the p-doped semiconductor layer 1 by means of a plasma (arrow).

By means of, for example, dry-chemical etching in the process step B), a mesa structure 6 in the semiconductor layer of the first type 1, the semiconductor layer of the second type 2 and the active layer 3 is formed, wherein the oblique side edge of the mask 5 continues in the semiconductor layer stack 11. The mesa structure 6 is advantageously formed laterally to the semiconductor layer of the first and the second type and to the active layer, for example as a side flank. Advantageously, the mesa structure 6 extends as an oblique side flank completely through the electrically conductive layer 7, through the semiconductor layer of the first type 1 and through the active layer 3. For example, the side flank of the mesa structure 6 extends only partially into the semiconductor layer of the second type 2, present in the n-doped semiconductor layer 2. In the etching process, the electrically conductive layer 7 can advantageously be partially removed, wherein an undercut of the mask 5 is formed.

In the method step B1), the mask 5 can be withdrawn from the mesa structure 6. For a mask, which comprises photoresist, for example, an oxygen-containing plasma is applied. The plasma removes the material of the mask 5 in such a way that it advantageously forms a resist retraction, which is adjustable by the duration of the treatment with the plasma. In FIG. 1b, the electrically conductive layer 7 completely covers the semiconductor layer stack 11 as far as the side flank of the mesa structure 6.

FIG. 1c shows a process diagram for the use of an oxygen-containing plasma during the process step B1). Here, a dependency of a lateral resist retraction during the removal of the mask from the duration of the application of the plasma is shown. For example, for the application of the plasma of 40 s a resist retraction of the mask of 1 µm away from the mesa structure takes place.

Figure 2A:
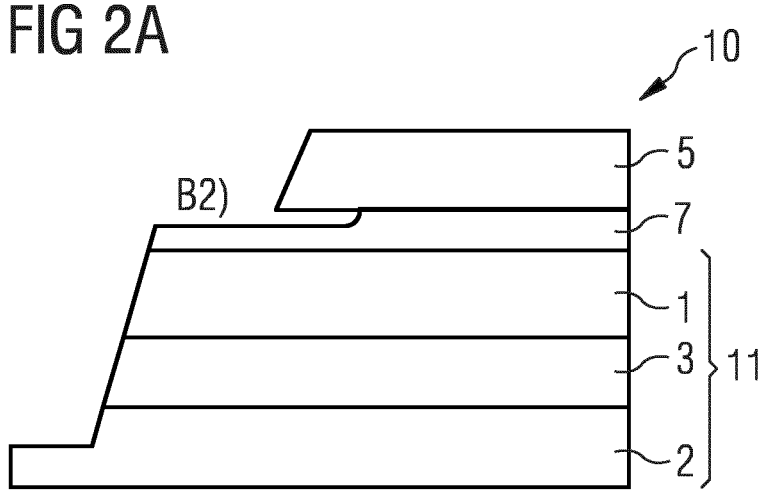

FIG. 2a shows the semiconductor layer stack 11 from FIG. 1b after a lateral retraction of the mask 5 in method step B1) and after another method step B2), in which the electrically conductive layer 7 is partially removed from the p-doped semiconductor layer 1 by means of a plasma. For example, the electrically conductive layer (7) is thinned in the partial removal. In particular, the electrically conductive layer has in regions where it is thinned, a smaller thickness than in regions where the electrically conductive layer is not thinned. Depending on the material of the electrically conductive layer 7 a plasma is applied in step B2), which is suitable for removal. If the electrically conductive layer 7 comprises, for example, ITO, it is advantageous to use a chlorine-containing plasma. The electrically conductive layer 7 is in the region adjacent to the mesa structure 6 and in a region below the mask 5 advantageously thinned, thus a gap is formed and the mask 5 is partially under etched.

The at least partial removal of the electrically conductive layer 7 can also be effected by means of a wet-chemical etching process as an alternative to the use of a plasma.

Figure 2B:
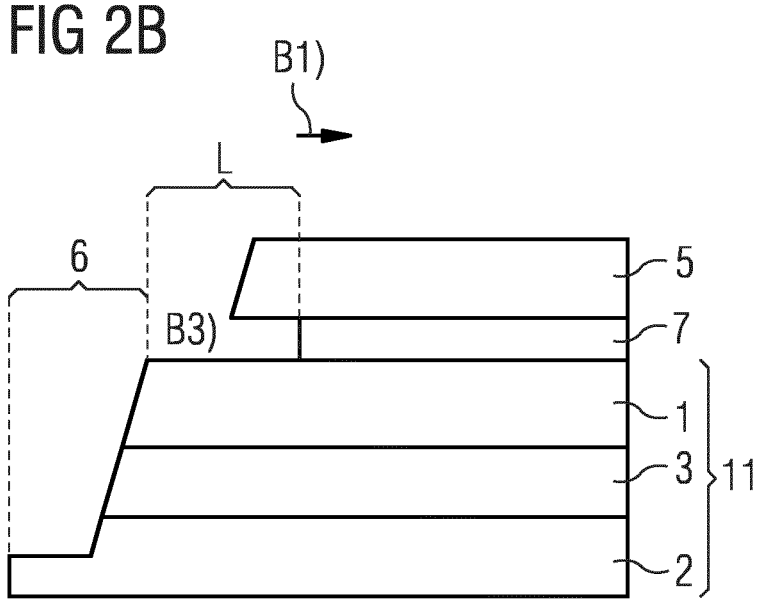

FIG. 2b shows the semiconductor layer stack 11 of the semiconductor chip 10 from FIG. 1b, wherein after the process step B1) in a process step B3) with a wet chemical etching process, the electrically conductive layer 7 is etched, so that the electrically conductive layer 7 is partially removed, wherein the after process step B1) remaining mask 5 is also partially under etched. The p-doped semiconductor layer 1, which is located directly below the electrically conductive layer 7, is free of the electrically conductive layer 7 after the method step B3) adjacent to the mesa structure 6 and partially below the mask 5 in a region L. The application of a wet chemical etching process in process step B3) enables to etch the electrical conductive layer 7 advantageously so that an at least partial removal of the electrically conductive Layer 7 is not bound to the structure which is predetermined by the mask 5. Depending on the duration of the etching process, it is further possible to control how much material of the electrically conductive layer 7 is removed and how far a gap resulting from the etching extends underneath the mask 5 between the mask 5 and the electrically conductive layer.

FIG. 3a shows the semiconductor layer stack 11 of the semiconductor chip 10 from FIG. 2B, wherein after method step B2) in a method step C) a passivation layer 8 is applied on the mesa structure by means of vaporizing or sputtering. In this case, before the method step C), the mask 5 can advantageously be retracted from the mesa structure. The passivation layer 8 may be a single layer, for example a dielectric, or may comprise a dielectric layer stack. The passivation layer 8 covers the side flank of the mesa structure and advantageously also the region L and extends to the remaining part of the mask 5 and advantageously covers it completely. A passivation layer 8 arranged in this way is advantageously characterized by improved adhesion to the mesa structure. Because the application of the passivation layer 8 to the mesa structure takes place immediately after the structuring and formation of the mesa structure, impurities on the mesa can be removed by further subsequent chip manufacturing method steps and resulting leakage currents are significantly reduced at the mesa structure. In the application of the passivation advantageously processes can be dispensed, in which an interaction of hydrogen involved in the process with the ITO of the electrically conductive layer rakes place and reduces the transparency of the electrically conductive layer. The mask 5 may remain in the semiconductor chip or may be removed.

In the FIG. 3b, the arrangement of FIG. 1b is shown, wherein after the application of the passivation layer 8, said passivation layer 8 extends in the gap between the mask 5 and the semiconductor layer stack 11. The passivation layer 8 and the electrically conductive layer 7 form an overlap, wherein the passivation layer 8 partially extends on the electrically conductive layer 7. The passivation layer 8 is also applied to the mask 5 and may partially extend into the gap, wherein the passivation layer 8 on the mask 5 with the passivation layer 8 on the electrically conductive layer 7 is not in direct contact with each other. This makes it possible that no the separation of the passivation layer 8 must take place, when the mask 5 is removed subsequently. Therefore, a clean separation of the mask 5 can be carried out without causing a strip off of the passivation layer 8. In a semiconductor chip produced in this way light, which is generated in the semiconductor layer stack 11, by an advantageous choice of the refractive index of the electrically conductive layer 7 with respect to the surrounding medium of the semiconductor chip can be coupled out improved because the total reflection between the electrically conductive layer 7 and the environment is reduced. Through the passivation, the mesa structure is sufficiently protected mechanically and against moisture and other environmental influences. Due to a sufficient thickness of the passivation layer 8 of at least 50 nm to at most 600 nm, interference of the emitted light can be reduced, which occur in thin passivations. The thickness of 600 nm is advantageous if the passivation layer 8 is formed as a dielectric Bragg mirror (DBR). As a result, fluctuations in the radiated brightness can advantageously be reduced.

The FIG. 3c shows an arrangement similar to FIG. 3b, wherein the electrically conductive layer 7 has been removed in a region adjacent to the mesa structure, for example by a wet chemical process, such that the semiconductor layer stack 11 in this area is free of the electrically conductive layer 7 and this area extends partially below the mask 5. The subsequently applied passivation layer 8 extends into the gap, but forms no overlap with the electrically conductive layer 7. The passivation layer 8 may extend to the electrically conductive layer 7. Advantageously, the electrically conductive layer 7 has a spacing of at least 0.5 μm from the mesa structure, wherein the semiconductor layer stack is free of the electrically conductive layer 7 in this area.

The FIG. 4a shows a schematic cross section through an optoelectronic semiconductor chip 10, which is formed as volume emitter. The semiconductor layer stack 11 has a mesa structure 6 in the form of a mesa trench, which has oblique side edges. The sidewalls of the mesa trench extend through the p-doped semiconductor layer of the first type 1, through the active layer 3 and partially through the n-type semiconductor layer of the second type 2. The mesa trench 6 has a passivation layer 8 on the oblique side flanks, on the bottom of the trench and on the top side of the p-doped semiconductor layer 1 of the first type 1. On the upper side of the p-doped semiconductor layer of the first type 1, the passivation layer 8 adjoins an electrically conductive layer 7.

In the mesa trench 6, a contact land 12 is introduced, which comprises metal and which contacts through an opening in the passivation layer 8 the n-type semiconductor layer of the second type 2 electrically. The contact land 12 has a width d of, for example, 5 μm and is advantageously arranged in the middle of the mesa trench 6. The electrically conductive layer 7 has an area which is not covered by the passivation layer 8 and by means of which radiation, for example blue light, can be coupled into an encapsulation 9. The encapsulation 9 covers the passivation layer 8, the contact land 12, the electrically conductive layer 7 and fills the mesa trench 6. Furthermore, the encapsulation 9 comprises, for example, silicone or an epoxy resin. The electrically conductive layer 7 forms on a side facing away from the semiconductor layer stack 11 a radiation side 10a of the semiconductor chip 10. By means of the passivation layer 8 advantageously no light is emitted in the direction of the contact land 12 of the semiconductor layer stack 11, whereby absorption at the side surfaces of the contact land 12 is reduced. As a result, the emission efficiency of the semiconductor chip 10 is advantageously increased. The passivation layer 8 comprises for reducing the absorption at the contact land 12 preferably one layer stack of several pairs of SiO2, MgF2, TiO2 or Nb2O5 layers which form a Bragg reflector.

Before introducing the contact land 12, the passivation layer 8 is locally opened in the mesa trench 6 for contacting the n-doped semiconductor layer of the second type 2. The opening may comprise exactly the width d of the contact land 12, for example 5 µm. Alternatively the opening in the passivation layer 8 may also have a smaller width than the width d of the contact land 12. For example, the contact land 12 may include a width d of at least 5 µm and into an opening in the passivation layer 8 of maximum 2 µm is introduced. As another alternative, the opening in the passivation layer 8 may also have a greater width than the width d of the contact land 12. For example, the contact land 12 may have a width d of at most 5 µm, and the opening in the passivation layer 8 may have a width of at least 8 µm.

FIG. 4b shows a schematic cross section along the contact land 12 from FIG. 4a. The contact land 12 is partially underlaid with the passivation layer 8. In other words, the contact land 12 contacts the n-doped semiconductor layer of the second type 2 only in regions. Due to the passivation layer 8 below the contact land 12, no light is coupled out through the n-doped semiconductor layer of the second type 2, whereby an absorption of light at these areas by the contact land 12 is avoided. The contact land 12 has an external contact region 12a, which serves for external contacting and is at least partially underlaid with the passivation layer 8, because no radiation of light is provided at this area. The external contact region 12a may comprise Au, for example. FIG. 4c shows a plan view of the semiconductor chip 10 according to FIGS. 4a and 4b. The mesa structure 6 into which the contact land 12 is inserted is formed in a central area of the semiconductor chip 10 and is covered with the passivation layer 8. The edge areas of the semiconductor chips 10 are also covered with the passivation layer 8. The passivation layer 8 and the electrically conductive layer 7 advantageously form at the mesa structure 6 and at the edge regions of the semiconductor chips 10 an overlap (not shown). Alternatively, there can be no overlap. The contact land 12 has seen in plan view advantageous at one end to a circular area, which may be configured as a contact point for external contact and has a diameter of, for example, at least 60 µm and at most 100 µm.

Another passivation layer 8a extends advantageously over the entire semiconductor chip 10 and covers the passivation layer 8 and the electrically conductive layer 7 advantageous completely. Also further components of the semiconductor chip 10, such as the contact land 12, may be at least partially covered by the further passivation layer 8a. The further passivation layer 8a comprises, for example, a dielectric layer or a dielectric layer stack. It is also possible that the further passivation layer 8a is a dielectric layer or a dielectric layer stack together with a Bragg mirror.

FIG. 4d, like FIG. 4c, shows a plan view of the semiconductor chip 10, wherein the semiconductor layer stack 11 has on one outer side a side surface 11a with a structured surface, and the semiconductor layer stack 11 has a recess, wherein a side surface 11b of the semiconductor layer stack 11 faces the recess and has a smooth surface.

The structured surface advantageously has a plurality of protrusions and depressions, for example a waveform.

In a top view of the semiconductor layer stack 11 the waveform may advantageously have a perforation, similar to the edge of a stamp.

FIG. 5a shows, in a schematic side view, a semiconductor layer stack 11 of an optoelectronic semiconductor chip 10 in which the semiconductor layer of the first type 1 is n-doped and the semiconductor layer of the second type 2 is p-doped and faces a carrier 14. The semiconductor chip 10 is formed in a thin film construction as a surface emitter. The n-doped semiconductor layer of the first type 1 forms a radiation side 10a of the semiconductor chip 10 and has a roughened top surface. The semiconductor layer stack 11 has laterally on the side a mesa structure 6, which extends to the carrier 14.

The passivation layer 8 covers the mesa structure 6 at least at the pn-junction and partially extends to the structure of the roughening.

In the FIG. 5b, the passivation layer 8 also extends partially to the emission side 10a of the n-doped Semiconductor layer of the first type 1, in other words on the roughened top surface 1a. The active layer 3 generates, for example, blue light which impinges on the roughened top side 1a of the n-doped semiconductor layer of the first type 1. FIG. 5a shows a direct transition from the refractive index of the n-doped semiconductor layer of the first type 1 to the refractive index of the environment, for example air. Through the roughening the leap of the refractive index to the environment is reduced. In other words, along a spatial direction perpendicular to the roughened top surface, the rate of change of the effective refractive index is reduced by the roughening. Furthermore, the roughening changes the angle under which the electromagnetic radiation generated in the chip impinges to the interface of the semiconductor layer and the environment, whereby the probability of multiple total reflection of the electromagnetic radiation is reduced at this interface. Advantageously, the roughening thus improves the efficiency with which electromagnetic radiation is coupled out of the semiconductor chip.

Furthermore, it is also possible for the semiconductor chip 10 to have an encapsulation covering the roughened top surface 1a (not shown). Thereby the out coupling coefficient of the semiconductor chip through the inequality of out- and rein-coupling. The out coupling coefficient of the semiconductor chip can be increased by the application of the passivation layer 8.

The invention is not limited by the description based on the embodiments of these. Rather, the invention encompasses every new feature as well as every combination of features, which in particular includes any combination of features in the patent claims, even if this feature or combination itself is not explicitly described in the claims or embodiments.

This patent application claims the priority of German Patent Application 102016105056.3, the disclosure of which is hereby incorporated by reference.

REFERENCE SIGNS 1 semiconductor layer of a first type
1a roughened top surface
2 semiconductor layer of a second type
3 active layer
5 structured mask
6 mesa structure
7 electrically conductive layer
8 passivation layer 8a further passivation layer
9 encapsulation
10 semiconductor chip
10a radiation side
11 semiconductor layer stack
12 contact land
12a external contact region
14 carrier
A) method step
A0) method step
A1) method step
B) method step
B1) method step
B2) method step
B3) method step
C) method step
L region
d width of contact land

The invention claimed is:

1. A method for producing an optoelectronic semiconductor chip comprising the steps of:
   A) providing a semiconductor layer stack comprising a semiconductor layer of a first type, a semiconductor layer of a second type and an active layer arranged between the semiconductor layer of the first type and the semiconductor layer of the second type,
   A0) applying an electrically conductive layer over the semiconductor layer of the first type or over the semiconductor layer of the second type,
   A1) applying a patterned mask on the semiconductor layer of the first type or on the semiconductor layer of the second type,
   B) forming a mesa structure in the semiconductor layer of the first type, the semiconductor layer of the second type and the active layer,
   B3) at least partially removing the electrically conductive layer in a region which directly adjoins the mesa structure and partially extends under the mask, by means of a wet-chemical etching process, and
   C) applying a passivation layer to the mesa structure by means of vapor deposition or sputtering, wherein the passivation layer comprises a dielectric layer stack.

2. The method for producing an optoelectronic semiconductor chip according to claim 1, wherein the semiconductor chip comprises a sapphire substrate, a SiC substrate or a GaN substrate.

3. The method for producing an optoelectronic semiconductor chip according to claim 1, wherein after the method step C) the mask is completely removed.

4. The method for producing an optoelectronic semiconductor chip according to claim 1, wherein the dielectric layer stack comprises an adhesion layer, wherein after the application of the passivation layer, the adhesion layer faces the semiconductor layer stack.

5. The method for producing an optoelectronic semiconductor chip according to claim 1, wherein after the method step C) an encapsulation is applied to a radiation side of the semiconductor chip.

6. The method for producing an optoelectronic semiconductor chip according to claim 1, wherein after step B) and before step C) in a step B1) by means of a plasma, the mask is partially removed from the electrically conductive layer.

7. The method for producing an optoelectronic semiconductor chip according to claim 6, wherein the removal of the mask in method step B1) is controlled by a duration of method step B1).

8. The method for producing an optoelectronic semiconductor chip according to claim 1, wherein prior to method step C) in a method step B2) by means of a plasma, the electrically conductive layer is partially removed from the semiconductor layer of the first type or the semiconductor layer of the second type.

9. The method for producing an optoelectronic semiconductor chip according to claim 8, wherein the removal of the electrically conductive layer in method step B2) is controlled by a duration of method step B2).

10. The method for producing an optoelectronic semiconductor chip according to claim 1, wherein the semiconductor layer of the first type or the semiconductor layer of the second type is provided with a roughened surface.

11. The method of manufacturing an optoelectronic semiconductor chip according to claim 10, wherein the passivation layer is applied at least partially on the roughened surface.

12. An optoelectronic semiconductor chip comprising:
   a semiconductor layer stack having a semiconductor layer of a first type a semiconductor layer of a second type and an active layer which is arranged between the semiconductor layer of the first type and the semiconductor layer of the second type, wherein a mesa structure is formed in the semiconductor layer of the first type, the semiconductor layer of the second type and the active layer, the semiconductor layer stack has at an outer side a side surface with a structured surface and the semiconductor layer stack has a recess, wherein a side surface of the semiconductor layer stack faces the recess and has a smooth surface,
   a passivation layer on the mesa structure, wherein the semiconductor chip further comprises an electrically conductive layer over the semiconductor layer of the first type or over the semiconductor layer of the second type, wherein the passivation layer extends partially onto the electrically conductive layer, and
   a further passivation layer which is arranged on the electrically conductive layer and on the passivation layer.

13. The optoelectronic semiconductor chip according to claim 12, wherein the semiconductor chip comprises a contact land which is arranged in the mesa structure and which contacts the semiconductor layer stack electrically, wherein the passivation layer is partially located between the semiconductor layer stack and the contact land.

14. The optoelectronic semiconductor chip according to claim 12, wherein the semiconductor chip comprises a sapphire substrate, a SiC substrate or a GaN substrate.

15. The optoelectronic semiconductor chip according to claim 12, wherein the passivation layer extends on the electrically conductive layer at most 10 μm in a direction away from the mesa structure.

16. A method for producing an optoelectronic semiconductor chip comprising the steps of:
   A) providing a semiconductor layer stack comprising a semiconductor layer of a first type, a semiconductor layer of a second type and an active layer arranged between the semiconductor layer of the first type and the semiconductor layer of the second type, wherein the semiconductor layer of the first type or the semiconductor layer of the second type is provided with a roughened surface,
   A0) applying an electrically conductive layer over the semiconductor layer of the first type or over the semiconductor layer of the second type, A1) applying a patterned mask on the semiconductor layer of the first type or on the semiconductor layer of the second type,
B) forming a mesa structure in the semiconductor layer of the first type, the semiconductor layer of the second type and the active layer, whereby in forming the mesa structure, the electrically conductive layer on the semiconductor layer stack is at least partially removed, so that a gap between a mask and the semiconductor layer stack is generated,
B3) at least partially removing the electrically conductive layer in a region which directly adjoins the mesa structure and partially extends under the mask, by means of a wet-chemical etching process, and
C) applying a passivation layer to the mesa structure by means of vapor deposition or sputtering.

* * * * *